(12) United States Patent
Bräuer et al.

(10) Patent No.: US 6,241,824 B1
(45) Date of Patent: Jun. 5, 2001

(54) APPARATUS FOR THE COATING OF SUBSTRATES IN A VACUUM CHAMBER

(75) Inventors: Günter Bräuer, Freigericht; Hermann Kloberdanz, Linsengericht; Hans-Georg Lotz, Gründau; Jochen Schneider, Messel; Alfons Zöller, Bad Soden-Salmünster; Harro Hagedorn; Michael König, both of Frankfurt; Jürgen Meinel, Langen; Götz Teschner, Dresden, all of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/366,971

(22) Filed: Aug. 4, 1999

(30) Foreign Application Priority Data

Aug. 4, 1998 (DE) ................................ 198 35 154

(51) Int. Cl.[7] .................................................. C23C 16/00
(52) U.S. Cl. ............... 118/730; 118/719; 118/729; 118/500; 118/503; 204/298.25; 204/298.26; 204/298.28
(58) Field of Search .................. 204/298.23, 298.25, 204/298.26, 298.27, 298.28; 118/719, 500, 730, 729, 503

(56) References Cited

U.S. PATENT DOCUMENTS

| 4,699,554 | 10/1987 | Kawashima | 414/217 |
|---|---|---|---|
| 4,886,592 | * 12/1989 | Anderle et al. | 204/298 |
| 4,969,790 | * 11/1990 | Petz et al. | 414/217 |
| 5,611,861 | * 3/1997 | Higashi | 118/719 |

FOREIGN PATENT DOCUMENTS

| 3735284A1 | 4/1989 | (DE) | C23C/14/50 |
|---|---|---|---|
| 3827343A1 | 2/1990 | (DE) | C23C/14/50 |
| 4232959A1 | 4/1994 | (DE) | C23C/14/56 |
| 4340522A1 | 6/1995 | (DE) | B65E/44/07 |

* cited by examiner

Primary Examiner—Nam Nguyen
Assistant Examiner—Steven H. Versteeg
(74) Attorney, Agent, or Firm—Smith, Gambrell & Russell, LLP

(57) ABSTRACT

In an apparatus for the coating of substrates in a vacuum with rotatable substrate carriers (15,16,20) and with a loading and an unloading station (8 or 9), two vacuum chambers (3,4) are provided with several coating stations (6,7 or 10 to 14), directly next to one another, wherein a rotatable transport arm (15 or 16) is accommodated in each of the two chambers (3, 4), and the transport planes of the two transport arms (15,16) are aligned with one another. In the separation area of the two chambers (3,4), an air lock is provided with a corresponding transfer apparatus (5) with two transport arms (15,16), whose rotary plate (20) is provided with substrate storage unit (21,22) and projects about halfway into one chamber (3) and halfway into the other chamber (4), wherein one chamber (3) has both the loading as well as the unloading station (8 or 9).

6 Claims, 5 Drawing Sheets

APPARATUS FOR THE COATING OF SUBSTRATES IN A VACUUM CHAMBER

INTRODUCTION AND BACKGROUND

The present invention concerns an apparatus for the coating of substrates in a vacuum with a rotatable substrate carrier with at least one coating station and with one loading and unloading station.

A cathode sputtering unit for the coating of substrates in a vacuum chamber is known (German DE 39 12 295), in which a rotating substrate carrier is accommodated, with at least one cathode station, one loading station and unloading station. The substrate carrier includes at least one transport ladle, and the transport ladle comprises a substrate holder, which can preferably be moved in the direction of the axis of the cathode station, or of the loading station, or of the unloading station. The transport ladle is formed from a substrate holder, which is preferably designed in the form of a circular disk, and an arm, which is designed and arranged so that the holder is always oriented parallel to the parts it interacts with during its movement, such as parts of the sputtering cathode, parts of the loading station and parts of the unloading station.

For one or more transport ladles, a drive apparatus is provided that is centered with regard to the cathode sputtering unit, and that further transports the transport ladle, at a certain angle, stepwise in the vacuum chamber of the cathode sputtering unit. The vacuum chamber of the cathode sputtering unit is placed vertical and the transport ladle, or the transport ladles, rotate around a horizontally arranged axis.

This known cathode sputtering unit is particularly suitable for the coating of flat data carriers with the shape of circular disks, which are provided with several thin layers in a vacuum chamber, wherein all layers are applied by means of a sputtering process.

Furthermore, an apparatus is known for the introduction and removal of an essentially flat workpiece into an evacuated coating chamber and for the supply and return of the workpiece into and out of the area of a coating source for the purpose of treating the workpiece surface (German DOS 37 16 498), wherein a coating apparatus located in the area of the coating chamber is provided with one or more cover-shaped workpiece carriers, which help to position the workpieces adjacent to an opening of the coating chamber. This opening can be closed, on the one hand, by the workpiece carrier and on the other hand, by a lifting plate, which is maintained and guided on a rotary plate that can pivot within the coating chamber, wherein the workpiece carrier can be pressed to the opening in the cover of the coating chamber by a lifting cylinder supported on the coating apparatus, and the lifting plate by a lifting device affixed to the bottom plate.

Also, this known apparatus is provided only for a coating with the aid of sputtering cathodes.

Furthermore, a clean space with a conveying device, which transports transport containers from one processing station to the next, is known (German DE 36 03 538), with the following features:

the clean space can be completely encapsulated;
at least one supply and removal device transfers the carrier, via an air lock, into the work area of the conveying device and removes it via an air lock;
the conveying device has a carrier arm that can rotate around an axis; and
the processing stations are located in a swivel area of the carrier arm, wherein the supply and removal device has at least one rotating disk with a shield between the transport containers.

Finally, an optical lens made of a transparent plastic and a first layer made of SiO directly on the substrate is known (German DE 44 30 363), wherein the second layer is made of borosilicate glass with a refractive value of 1.47 (lambda 55 nm) and has a thickness of up to 3 i, preferably 2550 nm, and the layers three to seven are formed from $TiO_3$, $SiO_2$, $Al_2O_3$ for the purpose of an antireflection effect. The apparatus for the production of the thin layers on the plastic line has a plasma source opposite the plastic substrate, at least one evaporator, in addition to the plasma source, and at least one ring magnet above the substrate.

It is therefore and object of the present invention to provide layers to, in particular, spherically shaped substrates, for example, eyeglasses, in one continuous process, and to apply these layers with a particularly high degree of layer thickness uniformity by means of various types of coating sources.

SUMMARY OF THE INVENTION

The above and other objects of the invention can be achieved, in accordance with the invention, with the provision of two adjacent vacuum chambers, wherein in each of the two chambers, a rotatable substrate carrier is provided. The rotational axis of the two substrate carriers are oriented parallel to one another and the transport planes of the substrate carriers are aligned with respect to one another. Air lock is with a substrate transfer device, corresponding to the two substrate carriers, are provided in the separation area of the two chambers and one of the chambers has the loading and unloading station.

BRIEF DESCRIPTION OF THE DRAWINGS

The invention will be further understood with reference to the accompanying drawings which illustrate one embodiment represented schematically, and wherein.

DETAILED DESCRIPTION OF THE INVENTION

The invention will now be described in further detail with reference to the foregoing drawings.

Figure 1:
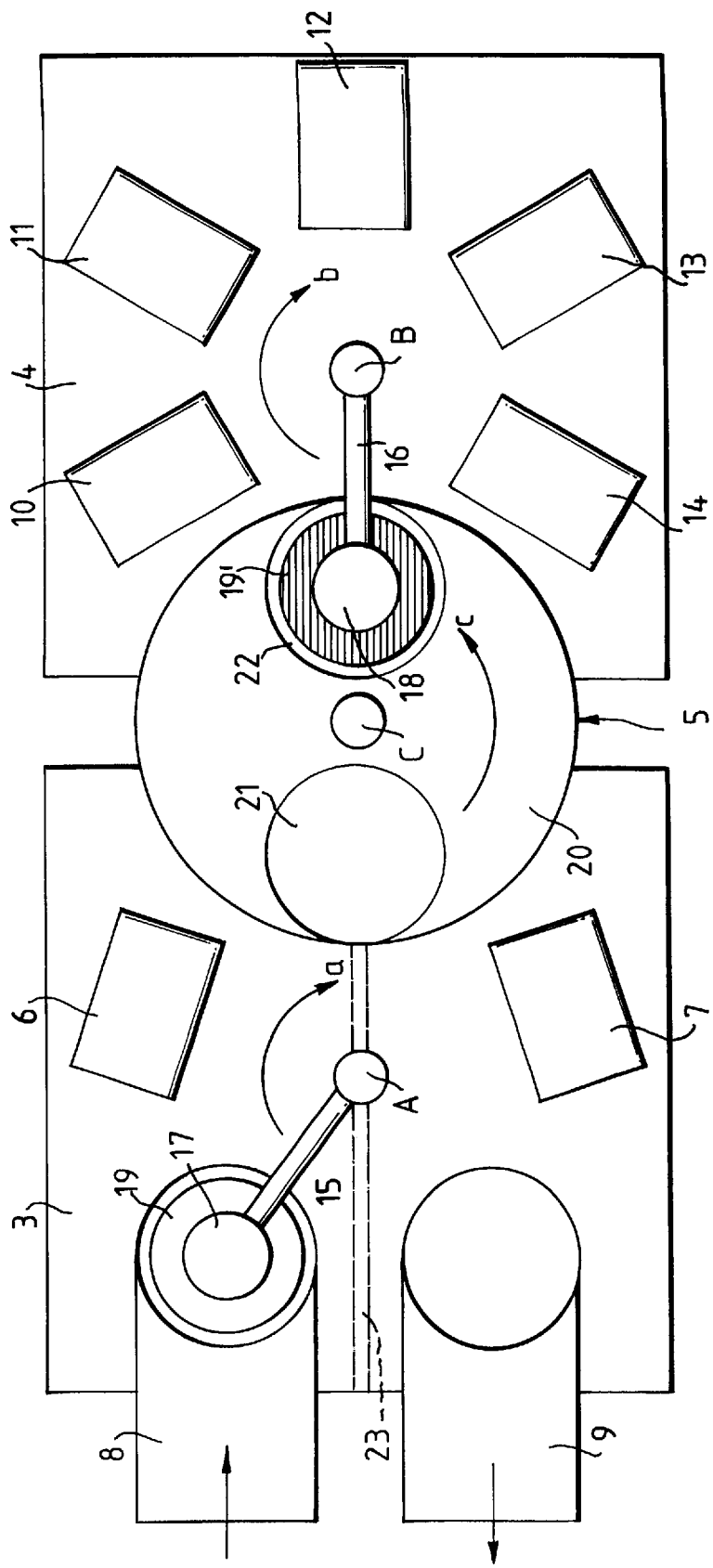
FIG. 1 is a top view of the apparatus of the invention at the beginning of a typical operation.

Referring to FIG. 1, the apparatus includes two vacuum chambers 3,4, separated from one another but directly adjacent, a substrate transfer device 5 with a transport plate 20 rotatable around an axis C, located in the separation area between the two vacuum chambers 3,4, two PECVD (Plasma Enhanced Chemical Vapor Deposition) sources 6,7 provided in the first vacuum chamber 3, an introduction station 8 and a removal station 9, a total of five sputter sources 10 to 14 located in the second vacuum chamber 4, and transport arms 15,16 supported in the two vacuum chambers and rotating around vertical axis A in the direction of arrow a, and around vertical axis B in the direction of arrow b, respectively with grippers 17,18 in order to affix the substrates 19,19' on the free ends of the arms.

Figure 2:
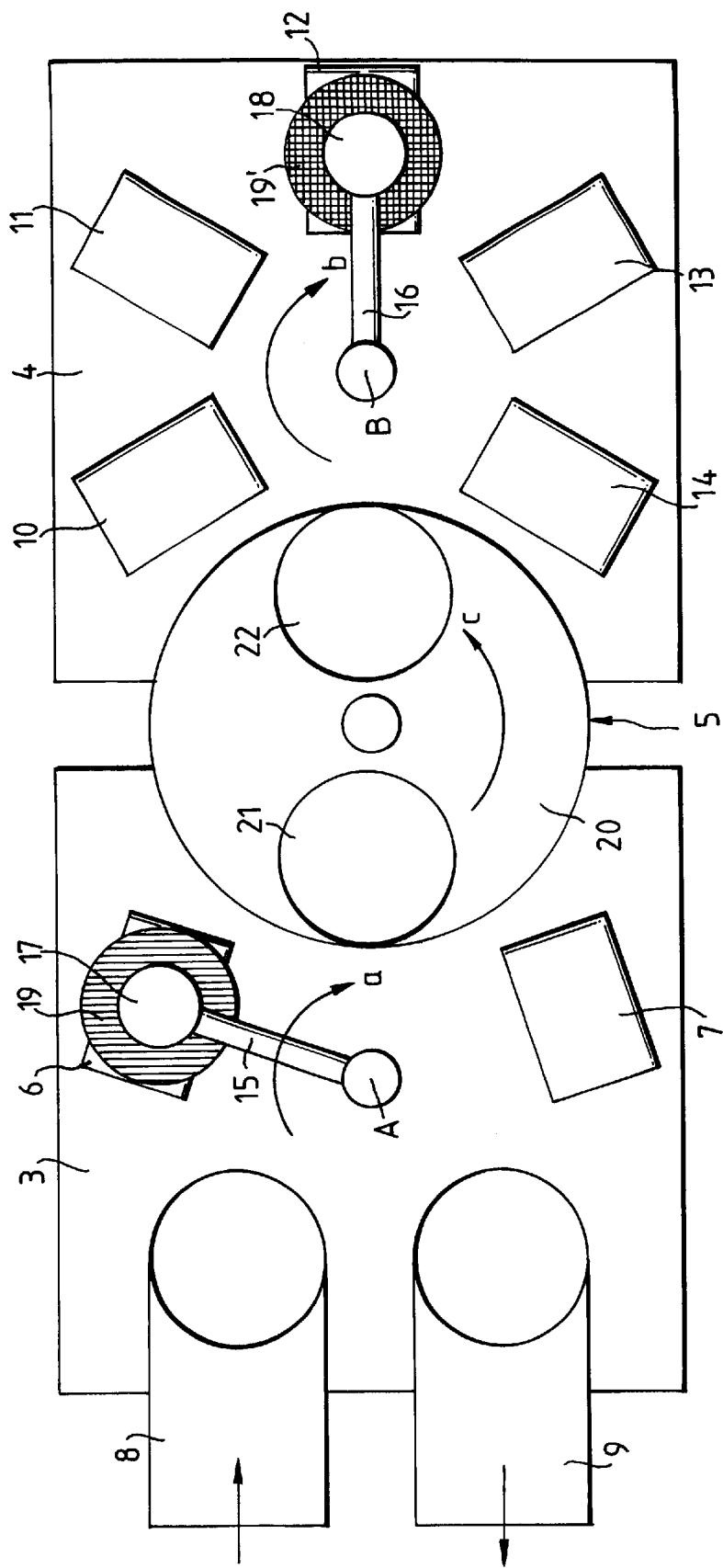
FIG. 2 is a top view of the apparatus of the invention in the next step of the process.

In the processing phase represented in FIG. 1, a substrate 19 was introduced into the vacuum chamber 3 and taken up by the transport arm 15 or its grippers 17; at the same time there is a second substrate 19', already provided with a first layer, in the area of the transfer device 5, where it was taken up by the transport arm 16 or its grippers 18. For the purpose of further coatings, the untreated substrate 19 is transported into the area of the PECVD source 6, stepwise, by the transport arm 15, where it remains for a previously determined time, whereas, at the same time, in the same period of time, the substrate 19' is moved from its position to the transport plate 20 of the transfer station 5 in one uniform transport movement by the transport arm 16, in the direction of the arrow b, past the sputter sources 10, 11 to the area of the source 12 (see FIG. 2).

Figure 3:
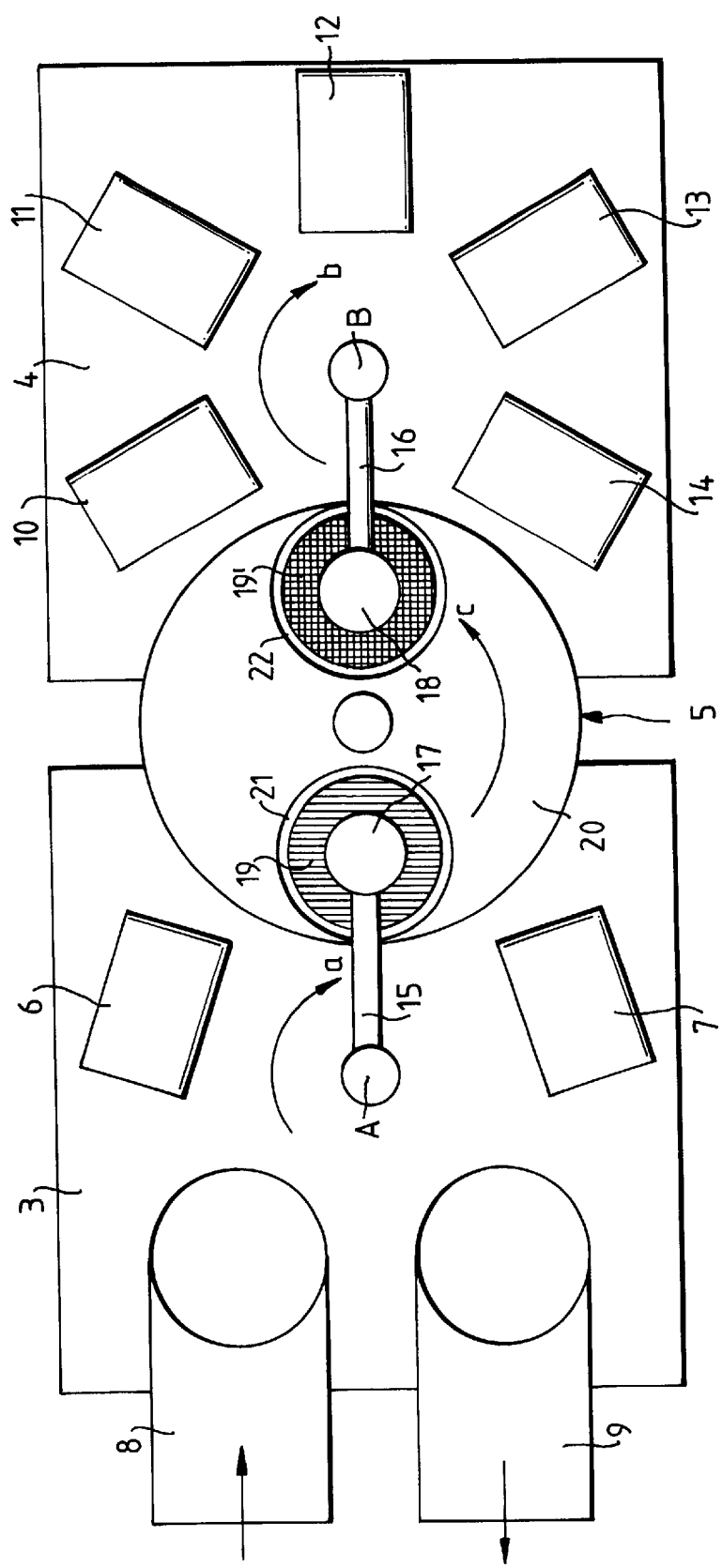
FIG. 3 is a top view of the apparatus of the invention showing the arrangement in the next step following the step shown in FIG. 2.

In the next phase of the coating process, the substrate 19 is moved, stepwise in the position shown in FIG. 3 on the transport plate 20, where it remains for a certain time until the substrate 19' has moved from the source 12 to the transport plate 20.

Figure 4:
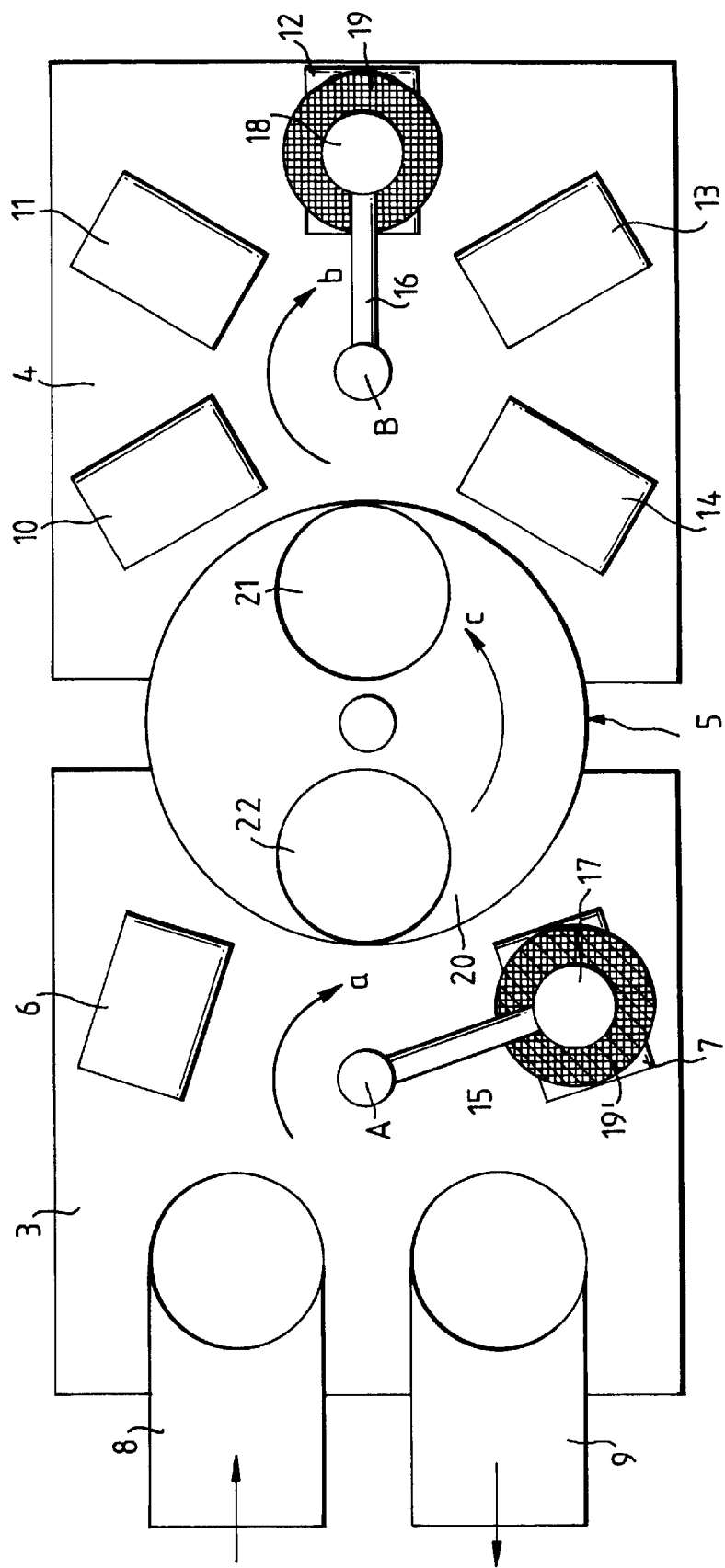
FIG. 4 is a top view of the apparatus of the invention showing the next step following the steps shown in FIG. 3.

In the next phase of the coating process shown in FIG. 4 the transport plate is turned in the direction of the arrow c by 180° so that the substrates 19, 19' exchange their position on the transport plate 20 and the substrate 19' is positioned over the source 7 in one transport step, whereas the substrate 19 is swiveled uniformly, in the direction of the arrow b, until it is over the source 12.

Figure 5:
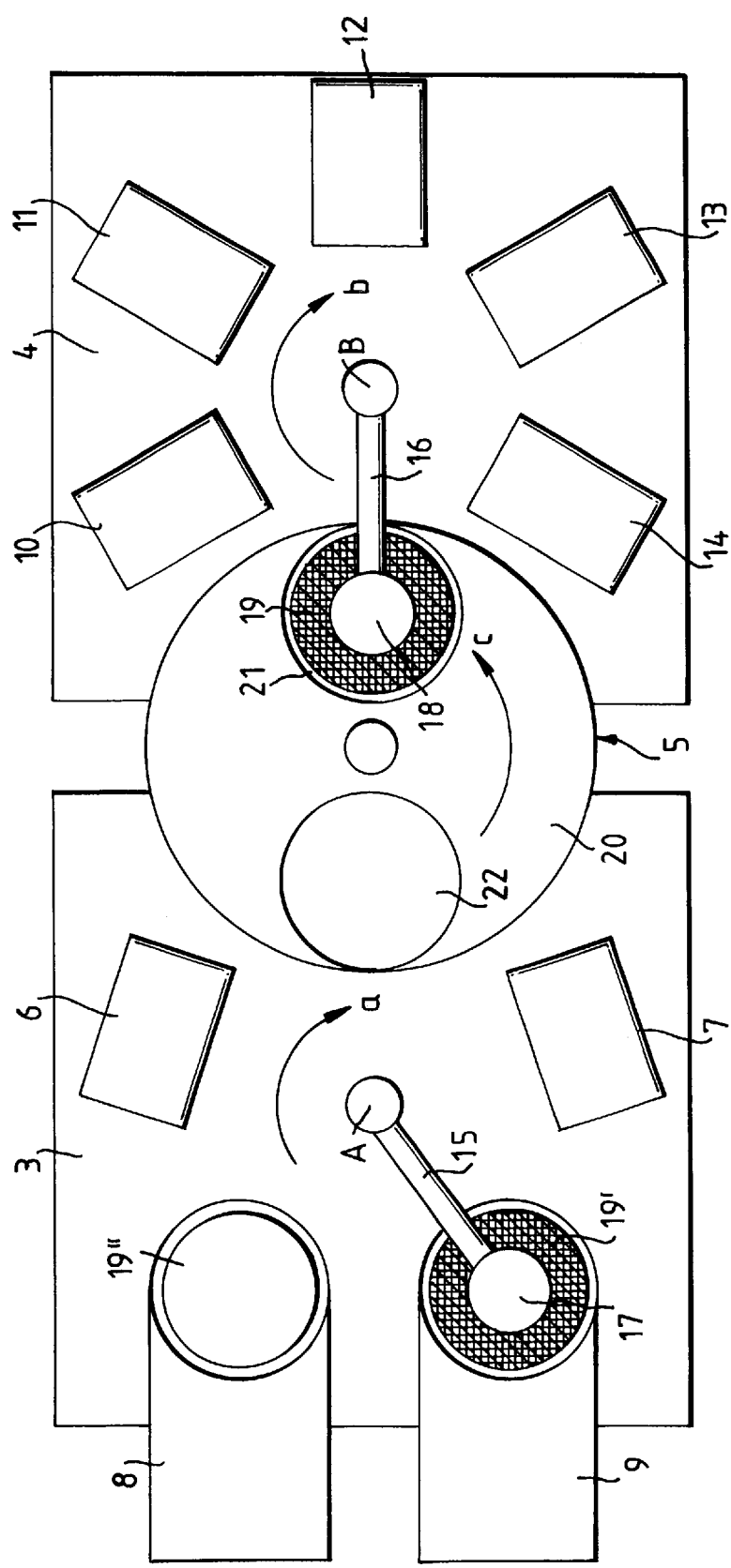
FIG. 5 is a top view of the apparatus of the invention showing the last step in completion of the illustrated cycle depicted in the foregoing drawings.

In the next phase of the coating process, represented in FIG. 5, the completely coated substrate 19' reaches the removal station 9, whereas the substrate 19 provided with six layers reaches a position on the transport plate 20. It is clear that the previously described process course is coordinated in such a way that at the same time a completely coated substrate 19,19' . . . , provided with seven layers; is removed, another still uncoated substrate 19", . . . is introduced via station 8 into the vacuum chamber 8, so that continuous operation can be achieved in the process course.

The process gases introduced into the vacuum chamber 3 can be, for example, HMDSO (hexamethyl disiloxane) and oxygen/nitrogen, wherein the layer produced with source 6 can be a scratch-proof layer and the layer produced with source 7 can be a water-repellent layer, for which purpose sources 6,7 are each connected to an R. F. current supply. These details are well known in the art.

The sources 10 to 14 located in the vacuum chamber 4 are cathodes with metal targets for the atomizing of reactive layers (for example, titanium dioxide, silicon dioxide), for which purpose the process gases may be, for example, oxygen and argon. Such targets are well known in the art.

As can be seen from FIGS. 1 to 5, the motors driving the two transport arms 15,16 and the transport plate 20 act together in such a way that the substrates 19,19', . . . remain in the area of the two sources 6,7 longer than in the area of one of sources 10 to 14, for which purpose the transport arm 15 moves suddenly or in steps and thus a static coating is made possible, whereas the transport arm 16 revolves continuously and thus makes possible dynamic coatings.

It is clear that instead of a total of five different coating sources 10 to 14 in the vacuum chamber 4, for example, only two coating sources can also be provided (for example, for the production of a highly refractive and a low-refractive layer), for which purpose the synchronization of the revolving parts—that is, the transport arms 15,16 and the transport plate 20, respectively—must be correspondingly coordinated.

In the case that the operation of the sources 6,7 of a vacuum chamber 3 requires different pressures and/or process gases, a partition 23 in the shape of a sheet-metal section, with an air lock for the passage of the transport arm 15 with substrate grippers 17, can be inserted into this chamber 3. The partition 23 is indicated with broken lines in FIG. 1. Similarly, a partition with an air lock for the passage of the transport arm 16 with substrate grippers 18, can be inserted into chamber 4.

Further variations and modifications will be apparent to those skilled in the art from the foregoing and are intended to be encompassed by the claims appended hereto.

German priority application 198 35 154.2 is relied on and incorporated herein.

We claim:

1. An apparatus for coating a plurality of substrates in a vacuum, comprising two vacuum chambers, two transport arms, at least one coating station and a loading and unloading station, said two vacuum chambers being directly next to one another, a transport arm supported within each of the two chambers, said transport arms having rotational axes, and a transport plane, wherein said rotational axes of said transport arms are parallel to one another and the transport planes of the transport arms are aligned with one another, wherein in a separation area of the two chambers, an air lock is provided with a transfer device associated with the two transport arms, and wherein one of two said chambers has said loading and unloading station.

2. The apparatus according to claim 1, further comprising that the transfer device has a motor-driven rotatable transport plate with at least two substrate storage units or substrate holders, which can be rotated in a plane with grippers of the transport arms, wherein the transport plate projects about halfway into each of the two vacuum chambers and is sealed with respect to adjacent chamber walls by means of air locks.

3. The apparatus according to claim 2, further comprising a partition, in one or both chambers, for gas separation, wherein the partition divides processing space, said partition having an air lock in a rotational plane of the transport arms so the transport arms can pass through.

4. The apparatus according to claim 2, further comprising that the transport arms and the transport plate are driven by a motor-gear unit, wherein a shaft for a transport arm and a shaft of the transport plate rotate in steps, and a shaft of the other transport arm rotates continuously.

5. The apparatus according to claim 1, further comprising a partition, in one or both chambers, for gas separation, wherein the partition divides processing space, said partition having an air lock in a rotational plane of the transport arms so the transport arms can pass through.

6. The apparatus according to claim 1, further comprising that the transport arms and a transport plate are driven by a motor-gear unit, wherein a shaft for a transport arm and a shaft of the transport plate rotate in steps, and a shaft of the other transport arm rotates continuously.

* * * * *